United States Patent
Ryan et al.

[11] Patent Number: 5,243,221
[45] Date of Patent: Sep. 7, 1993

[54] ALUMINUM METALLIZATION DOPED WITH IRON AND COPPER TO PREVENT ELECTROMIGRATION

[75] Inventors: Vivian W. Ryan, Nutley; Ronald J. Schutz, Warren, both of N.J.

[73] Assignee: AT&T Bell Laboratories, Murray Hill, N.J.

[21] Appl. No.: 1,203

[22] Filed: Jan. 5, 1993

Related U.S. Application Data

[60] Continuation of Ser. No. 780,554, Oct. 15, 1991, which is a continuation of Ser. No. 540,039, Jun. 19, 1990, abandoned, which is a division of Ser. No. 426,821, Oct. 25, 1989, Pat. No. 4,975,389.

[51] Int. Cl.[5] .................. H01L 23/48; H01L 29/46; H01L 29/54; H01L 29/62
[52] U.S. Cl. .................................. 257/767; 257/758; 257/762; 257/765
[58] Field of Search ............... 357/65, 67, 71, 68, 357/85; 437/197; 257/499, 758, 762, 765, 767

[56] References Cited

U.S. PATENT DOCUMENTS

| | | | |
|---|---|---|---|
| 3,725,309 | 4/1973 | Ames et al. | 357/65 |
| 3,900,598 | 8/1975 | Hall et al. | 357/67 |
| 4,268,584 | 12/1979 | Ahn et al. | 357/71 |
| 5,019,891 | 5/1991 | Onuki et al. | 357/67 |

Primary Examiner—Andrew J. James
Assistant Examiner—Carl Whitehead, Jr.
Attorney, Agent, or Firm—Bruce S. Schneider

[57] ABSTRACT

Stress induced grain boundary movement in aluminum lines used as connections in integrated circuits is substantially avoided by doping the aluminum with iron. Through this expedient not only is grain boundary movement avoided but electromigration problems are also decreased.

3 Claims, 3 Drawing Sheets

ALUMINUM METALLIZATION DOPED WITH IRON AND COPPER TO PREVENT ELECTROMIGRATION

This application is a continuation of application Ser. No. 07/780554, filed on Oct. 15, 1991, which is a continuation of Ser. No. 07/540039, filed Jun. 19, 1990 (now abandoned) which is a division of application Ser. No. 07/426,821 filed Oct. 25, 1989 U.S. Pat. No. 4,975,389.

FIELD OF THE INVENTION

This invention relates to the fabrication of silicon integrated circuits and, in particular, to the fabrication of silicon integrated circuits employing aluminum metallization.

ART BACKGROUND

At least one layer of patterned aluminum is utilized in essentially all silicon integrated circuits. The aluminum pattern is utilized to electrically interconnect various active regions within the integrated circuit. Typically, such aluminum lines are formed by depositing a layer of aluminum at elevated temperatures (250° to 400° C.), forming a polymer resist layer in a desired pattern over the aluminum, and removing through etching the exposed regions of the underlying aluminum to produce the corresponding desired pattern of aluminum electrical connections.

After the deposition of the aluminum layer at elevated temperature the subsequent cooling induces a significant stress in the aluminum layer and ultimately in the lines formed from the layer. This stress results from the difference in coefficients of expansion between the underlying substrate and the aluminum. Typically, the substrate after deposition changes dimension during cooling to a much smaller extent than the aluminum. Thus after cooling, substantial tensile stress is present in the aluminum. The extent of stress depends primarily on the specific composition of the substrate, the design rule employed, the particular device configuration, and the dielectric material used to overcoat the aluminum. However, often with design rules of 1 $\mu$m or smaller, the mechanical-stress-gradient is sufficient to cause a movement of the grain boundaries in the aluminum, denominated creep, that results in voids and electrical opens in the aluminum conductors.

Strict design rules also cause additional difficulties. In particular, since narrower aluminum lines are employed at stricter design rules, the same currents as used for devices with less strict design rules yield substantially higher current densities. The relatively high resulting current density with the concomitant current-stress gradient, leads to material motion along aluminum grain boundaries, denominated electromigration, in which opens in the aluminum line are produced. Attempts to avoid electromigration problems have involved, for example, an introduction of a titanium or copper dopant at levels up to 5 atomic percent into the aluminum. These attempts, however, have been considered unsatisfactory because such high concentrations of copper make dry-etch pattern definition more difficult, and lines more susceptible to corrosion. Thus, problems due to both creep and electromigration are present and are likely to become even more serious as design rules become stricter.

SUMMARY OF THE INVENTION

By introducing an iron dopant into the aluminum at relatively low concentration, e.g., levels typically up to 5 atomic percent preferably up to 1 atomic percent, not only is creep essentially avoided, but electromigration problems are substantially reduced. The relatively minor amount of iron present is easily introduced into the aluminum by techniques such as co-sputter deposition or interdiffusion.

BRIEF DESCRIPTION OF THE DRAWINGS

The FIGS. 1 to 3 are illustrative of properties associated with the invention.

DETAILED DESCRIPTION

Figure 1:
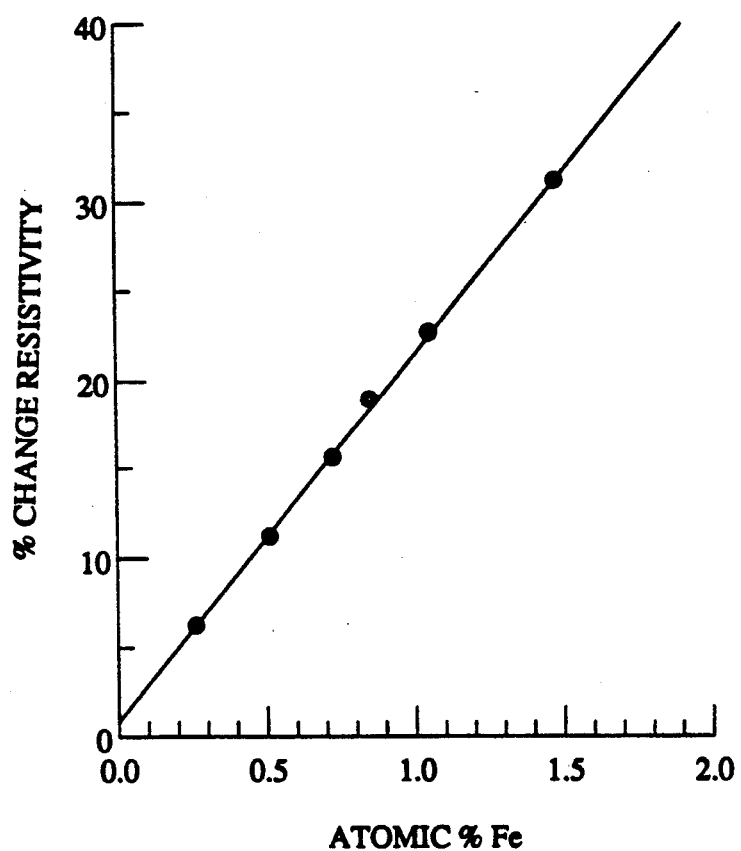

The addition of elemental iron as a dopant in aluminum for integrated circuit applications substantially increases resistance to electromigration and creep. The amount of iron utilized depends to an extent on the electrical requirements of the device, the geometry of the device, the substrate composition and the composition of any overlying layers. For example, the presence of a silicon nitride layer overlying the aluminum particularly enhances the induced tensile stress in the aluminum since there is a mismatch not only between the aluminum and the underlying substrate but also a substantial mismatch between silicon nitride and the substrate resulting in compressive stress in the silicon nitride. This compressive stress, in turn, induces an increased tensile stress in the aluminum interconnect. Although possible combinations of device configurations and materials are too numerous to allow universal specification of iron concentration parameters, typically the amount of iron utilized should be less than that which causes the resistivity of the resulting iron doped aluminum to be greater than 0.08 $\Omega/\square$. It is difficult to set the required concentration of iron for a specific circumstance because it is believed that only the portion in the grain boundaries makes a substantial contribution to the desired effect. Sufficient iron should be present to enhance the tensile yield strength of the aluminum line ultimately formed by at least 15 percent relative to that obtained for Al(0.5% Cu). (Yield strength is defined as the minimum mechanical tensile stress which marks a decrease of 20% from the extrapolated elastic response value.) Again, the amount necessary to produce the desired enhancement of yield strength varies with the device configuration and the materials utilized but generally for typical devices such as 0.9 $\mu$m-minimum dimension CMOS devices with an overlying layer of 0.9 $\mu$m thick silicon nitride, dopant concentrations of at least 0.2 atomic percent but less than 5 atomic percent are advantageously employed. (The additional presence of other dopants such as silicon, copper and titanium are not precluded.)

Various methods are available for forming an iron doped aluminum layer that is ultimately patterned, or for depositing iron doped aluminum in the desired pattern through a liftoff technique. (Liftoff techniques are described by R. J. Schutz in *VLSI Technology*, S. M. Sze ed., McGraw-Hill Book Company, NY, second edition, 1988, p. 197.) One advantageous method for forming an iron doped aluminum layer involves the sputtering of both iron and aluminum from a composite target. (Sputtering from a composite target is described by L. Maissel in *Handbook of Thin Film Technology*, L. I. Maissel and R. Glang, ed., McGraw-Hill Book Company, NY, 1970, p. 4-40-4-41.) The exact composition of iron relative to aluminum utilized in the target to obtain the desired level of iron in the deposited aluminum layer depends on a variety of conditions such as grain size, thermal history and impurity concentrations of the deposited film. However, a control sample is easily employed to determine a desired concentration of iron dopant in the target. It is also possible to form an iron doped aluminum layer by interdiffusion. Interdiffusion is accomplished by, for example, sequentially sputter depositing a thin layer (50 to 200 Å) of iron and a thin layer (0.5 to 1.0 μm) of aluminum onto a device substrate, then heating the structure at a temperature in the range 300° to 450° C.

Figure 3:
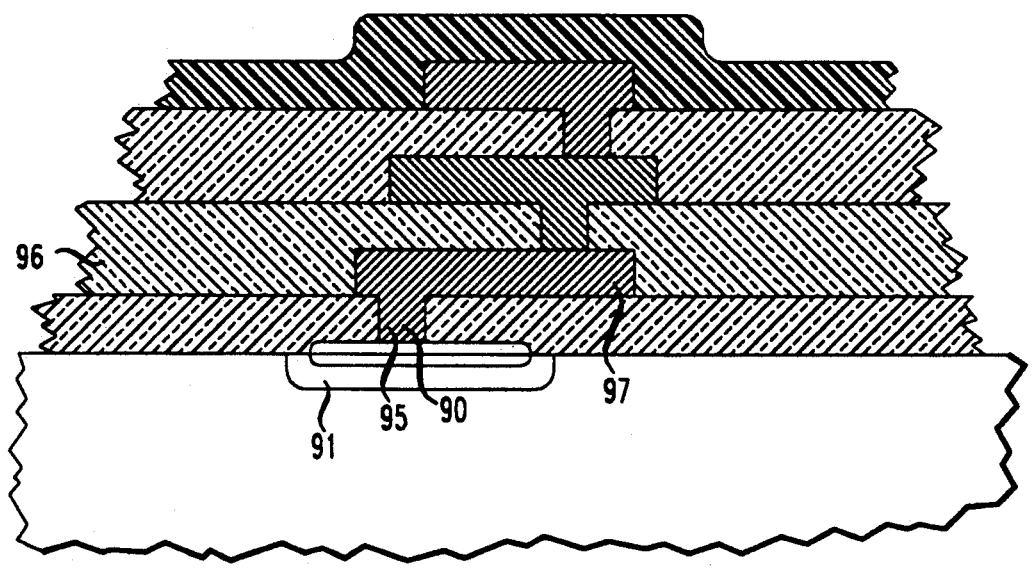

Use of iron doped aluminum is not confined to a single aluminum patterned layer, but is useful in device configurations utilizing multiple aluminum layers. (See S. P. Murarka in *VLSI Technology*, S. M. Sze ed., McGraw-Hill Book Company, NY, second edition, 1988, p. 414-416, for a description of devices utilizing multilayer metallization.) Indeed, the presence of a series of alternating aluminum and dielectric layers generally substantially increases the difficulties due to stress and thus makes the invention particularly advantageous. In one embodiment for making multi-layer metallization structures, tungsten metal (for example, 90 in FIG. 3), is selectively deposited on silicon only, such as the silicon present in at the source, 91, drain, or gate. This deposit provides excellent contact to the silicon and is capable of filling the via, 95, through the overlying dielectric, 96. The tungsten deposition in the via is then contacted with aluminum, 97, to form the interconnects and requires no diffusion barrier between the aluminum and the tungsten.

The following examples are illustrative of the properties of iron doped aluminum.

EXAMPLE 1

A 5 inch in diameter silicon substrate was coated by plasma enhanced chemical vapor deposition utilizing a tetraethoxy silane precursor with a silicon dioxide layer having a thickness of 1 μm. The sample was placed on the sample holder of an electron beam evaporation apparatus. The target (99.99 percent pure iron) was impact with an electron beam of 0.2 Amp at 10 kV and the resulting evaporation was continued for 5 sec to produce a layer thickness of 100 Å on the major surface of the substrate. Without breaking vacuum, the iron target was removed and an aluminum target (99.999 percent pure) was substituted. An electron beam of 0.3 Amp at 10 kV was employed for 22 sec producing a deposited aluminum layer thickness of 500 Å.

The sample was removed from the evaporation equipment and placed on the sample holder of a magnetron sputter deposition apparatus. The apparatus was evacuated to a pressure of approximately $2 \times 10^{-7}$ Torr and the aluminum surface on the substrate was subjected to argon ions produced in a 13.56 MHz plasma for sufficient time that approximately 100 Å of aluminum was removed. The substrate was heated to a temperature of approximately 300° C. An aluminum/copper target (0.5 atomic percent copper) was subjected to argon ions from an argon plasma developed at 13.56 MHz with a power of 9 kW. The resulting deposition was continued for approximately 26 sec to produce a 0.5 μm thick copper doped aluminum layer.

Figure 2:
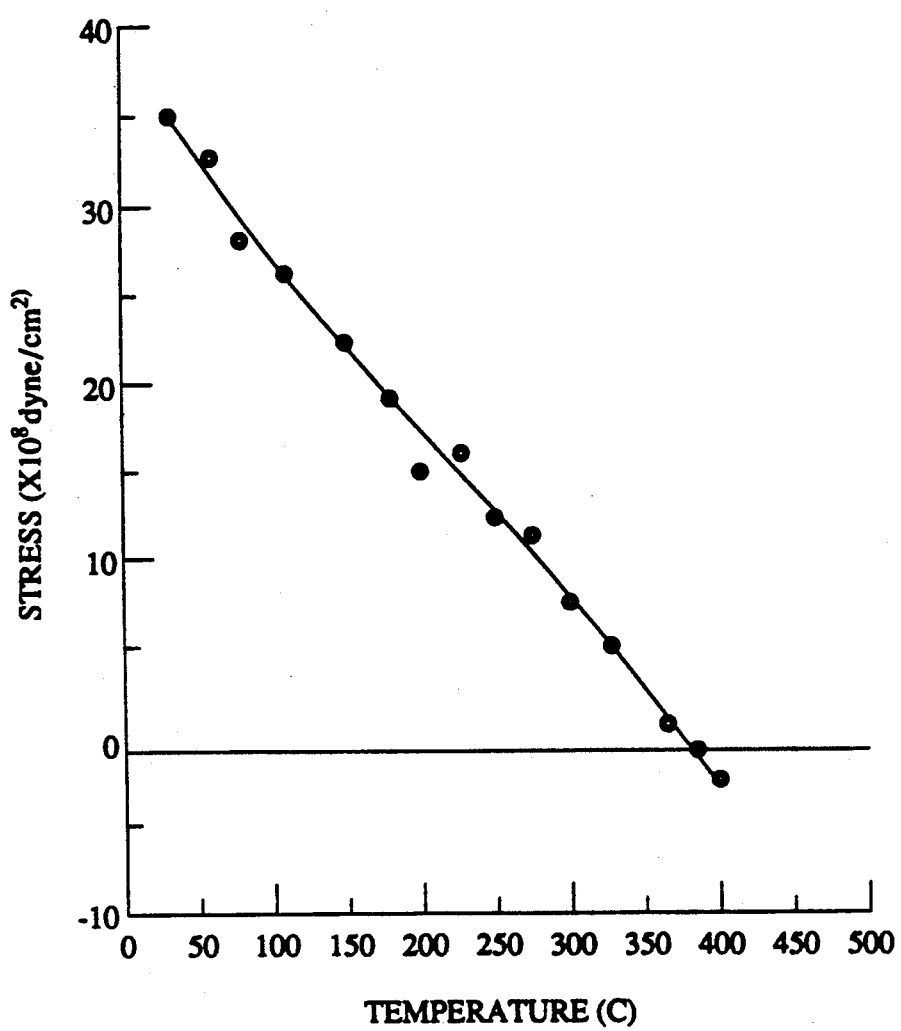

The wafer was removed from the sputtering apparatus and inserted in a resistively heated oven. This oven was fitted with an optically-levered laser beam stress-measurement apparatus as described in A. K. Sinha, H. J. Levinstein and T. E. Smith, *J. Appl. Phys.* 49(4), 1978, p. 2423-2424. The temperature was essentially linearly increased at a rate of 20° C. per minute to a temperature of 400° C. and maintained at this temperature for approximately one hour to induce interdiffusion of the iron into the copper doped aluminum region. The temperature after the one hour period was decreased linearly at a rate of 0.75° C./min to room temperature. During the cooling process the curvature of the wafer was measured utilizing the optically-levered laser beam apparatus and compared to initial measurements made on the same apparatus before deposition of the iron layer. By comparison of the curvature before deposition with the values obtained after the interdiffusion procedure, average in plane stress (shown in FIG. 2) across the film was calculated. The stress at which there is a 20 percent deviation from elastic behavior was approximately $16.7 \times 10^8$ dyn/cm$^2$.

EXAMPLE 2

The procedure of Example 1 was followed except various time periods for maintaining the interdiffusion temperature at 400° C. were employed. The use of different interdiffusion times produced a variation in the atomic percent of iron present in the aluminum layer. The level of iron present in each sample was measured by Rutherford backscattering and the resistivity of the aluminum film was measured as described in L. Maissel in *Handbook of Thin Film Technology*, L. I. Maissel and R. Glang, ed., McGraw-Hill Book Company, NY, 1970, p. 13-5-13-7. A graph of atomic percent of iron versus change in resistivity in the aluminum layer compared to an aluminum layer with no iron is shown in FIG. 1.

We claim:

1. A semiconductor device comprising a substrate comprising a silicon semiconductor material including active regions with electrical interconnects between said active regions wherein at least a portion of said interconnects are made with a material comprising iron doped aluminum whereby the tensile strength of said iron doped aluminum material is increased at least 15 percent relative to that obtained for aluminum doped with 0.5 atomic percent copper and wherein contact to said active regions is between said material and a second electrical conductor.

2. The device of claim 1 wherein said iron doped aluminum comprises aluminum doped with up to 0.5 atomic percent copper.

3. The device of claim 1 wherein said aluminum includes silicon.

* * * * *